US012313971B2

(12) United States Patent
Chavez et al.

(10) Patent No.: US 12,313,971 B2
(45) Date of Patent: May 27, 2025

(54) COATED UNDERLAYER FOR OVERCOATED PHOTORESIST

(71) Applicant: ROHM AND HAAS ELECTRONIC MATERIALS LLC, Marlborough, MA (US)

(72) Inventors: Anton Chavez, West Newton, MA (US); Iou-Sheng Ke, Andover, MA (US); Shintaro Yamada, Shrewsbury, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 260 days.

(21) Appl. No.: 17/368,231

(22) Filed: Jul. 6, 2021

(65) Prior Publication Data
US 2023/0057401 A1 Feb. 23, 2023

(51) Int. Cl.
*G03F 7/11* (2006.01)
*C08F 20/36* (2006.01)
*C09D 133/14* (2006.01)
*G03F 7/075* (2006.01)
*G03F 7/09* (2006.01)

(52) U.S. Cl.
CPC ............... *G03F 7/11* (2013.01); *C08F 20/36* (2013.01); *C09D 133/14* (2013.01); *G03F 7/0752* (2013.01); *G03F 7/091* (2013.01)

(58) Field of Classification Search
None
See application file for complete search history.

(56) References Cited

U.S. PATENT DOCUMENTS

| 3,474,054 | A | 10/1969 | White |
| 4,200,729 | A | 4/1980 | Calbo |
| 4,251,665 | A | 2/1981 | Calbo |
| 5,187,019 | A | 2/1993 | Calbo et al. |
| 6,329,117 | B1 | 12/2001 | Padmananban et al. |
| 7,582,412 | B2 | 9/2009 | Cameron et al. |
| 7,838,198 | B2 | 11/2010 | Chen et al. |
| 9,029,270 | B2 | 5/2015 | Sasaki et al. |
| 9,165,782 | B2 | 10/2015 | Endo et al. |
| 9,195,137 | B2 | 11/2015 | Endo et al. |
| 9,250,525 | B2 | 2/2016 | Endo et al. |
| 9,793,131 | B2 | 10/2017 | Ohashi et al. |
| 10,241,412 | B2 | 3/2019 | Nagai et al. |
| 10,242,871 | B2 | 3/2019 | Nishita et al. |
| 10,416,563 | B2 | 9/2019 | Satoh et al. |
| 10,527,942 | B2 | 1/2020 | Sim et al. |
| 2013/0115555 | A1* | 5/2013 | Shimizu ................. G03F 7/0045 526/265 |
| 2013/0256264 | A1* | 10/2013 | Tanaka ..................... G03F 7/094 524/199 |
| 2014/0186774 | A1 | 7/2014 | Glodde et al. |
| 2016/0147150 | A1 | 5/2016 | Hatakeyama et al. |
| 2016/0320703 | A1 | 11/2016 | Hong et al. |
| 2016/0334703 | A1 | 11/2016 | Jang et al. |
| 2017/0123319 | A1 | 5/2017 | Ryu et al. |
| 2017/0153547 | A1 | 6/2017 | Sim et al. |
| 2017/0283651 | A1 | 10/2017 | Sim et al. |
| 2018/0120706 | A1* | 5/2018 | Shirakawa ........... C09D 125/18 |
| 2019/0163064 | A1 | 5/2019 | Ohashi et al. |
| 2020/0142309 | A1* | 5/2020 | Liu ......................... G03F 7/094 |

FOREIGN PATENT DOCUMENTS

| JP | 2016170338 A | 9/2016 |
| KR | 20150075006 A | 7/2015 |
| WO | 2020066976 A1 | 4/2020 |

* cited by examiner

*Primary Examiner* — Mark F. Huff
*Assistant Examiner* — Richard David Champion
(74) *Attorney, Agent, or Firm* — CANTOR COLBURN LLP

(57) ABSTRACT

A method of forming a pattern, the method comprising applying a layer of a coating composition over a substrate; curing the applied coating composition to form a coated underlayer; and forming a photoresist layer over the coated underlayer, wherein the coating composition comprises a first material comprising two or more hydroxy groups; a second material comprising two or more glycidyl groups; an additive comprising a protected amino group; and a solvent.

16 Claims, No Drawings

COATED UNDERLAYER FOR OVERCOATED PHOTORESIST

FIELD

The present invention relates generally to field of manufacturing electronic devices, and more specifically to the field of materials for use in semiconductor manufacture.

BACKGROUND

Photoresist underlayer compositions are used in the semiconductor industry as etch masks for lithography in advanced technology nodes for integrated circuit manufacturing. These compositions are often used in tri-layer and quad-layer photoresist integration schemes, where an organic or silicon containing anti-reflective coating and a patternable photoresist film layers are disposed on the bottom layer having a high carbon content.

Spin-on Carbon (SOC) compositions are used as resist underlayer films in the semiconductor industry as etch masks for lithography in advanced technology nodes for integrated circuit manufacturing. These compositions are often used in tri-layer and quad-layer photoresist integration schemes, where an organic or silicon containing anti-reflective coating and a patternable photoresist film layers are disposed on the bottom layer having a high carbon content SOC material.

An ideal SOC material should possess certain specific characteristics: it should be capable of being cast onto a substrate by a spin-coating process, should be thermally set upon heating with low out-gassing and sublimation, should be soluble in common solvents for good spin bowl compatibility, should have appropriate n/k to work in conjunction with the anti-reflective coating layer to impart low reflectivity necessary for photoresist imaging, and should have high thermal stability to avoid being damaged during subsequent processing steps. In addition, it is desirable for the underlayer film to be sufficiently adhered to the substrate to avoid delamination when submerged, for example, during a standard cleaning process known as SC-1 using a hydrogen peroxide/ammonium hydroxide bath.

Accordingly, there remains a need for new photoresist underlayer materials that can improve adhesion to underlying substrates and have good strip resistance and resistance to SC-1 cleaning conditions.

SUMMARY

Provided is a method of forming a pattern including applying a layer of a coating composition over a substrate; curing the applied coating composition to form a coated underlayer; and forming a photoresist layer over the coated underlayer, wherein the coating composition comprises a first material comprising two or more hydroxy groups; a second material comprising two or more glycidyl groups; an additive comprising a protected amino group; and a solvent.

Also provided is a layered article including a substrate; a coated underlayer disposed over the substrate; and a photoresist layer disposed over the coated underlayer, wherein the coated underlayer is derived from a coating composition that includes a first material comprising two or more hydroxy groups; a second material comprising two or more glycidyl groups; an additive comprising a protected amino group; and a solvent.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the FIGURES, to explain aspects of the present description. As used herein, the term "and/or" includes all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of at least two; "cycloalkenyl group" refers to a cycloalkyl group having at least one carbon-carbon double bond; "alkynyl group" refers to a monovalent hydrocarbon group having at least one carbon-carbon triple bond; the term "aromatic group" denotes the conventional idea of aromaticity as defined in the literature, in particular in IUPAC 19, and refers to a monocyclic or polycyclic aromatic ring system that includes carbon atoms in the ring or rings, and optionally may include one or more heteroatoms independently selected from N, O, and S instead of a carbon atom or carbon atoms in the ring or rings; "aryl group" refers to a monovalent, monocyclic or polycyclic aromatic group containing only carbon atoms in the aromatic ring or rings, and may include a group with an aromatic ring fused to at least one cycloalkyl or heterocycloalkyl ring; "arylene group" refers to an aryl group having a valence of at least two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—". The symbol "*" represents a bonding site (i.e., point of attachment) of a repeating unit.

The prefix "hetero" means that the compound or group includes at least one member that is a heteroatom (e.g., 1, 2, 3, or 4 or more heteroatom(s)) instead of a carbon atom, wherein the heteroatom(s) is each independently selected from N, O, S, Si, or P; "heteroatom-containing group" refers to a substituent group that includes at least one heteroatom; "heteroalkyl group" refers to an alkyl group having 1-4 heteroatoms instead of carbon atoms; "heterocycloalkyl group" refers to a cycloalkyl group with one or more N, O or S atoms instead of carbon atoms; "heterocycloalkylene group" refers to a heterocycloalkyl group having a valence of at least two; "heteroaryl group" refers to an aryl group having 1 to 3 separate or fused rings with one or more N, O or S atoms as ring members instead of carbon atoms; and "heteroarylene group" refers to a heteroaryl group having a valence of at least two.

The term "halogen" means a monovalent substituent that is fluorine (fluoro), chlorine (chloro), bromine (bromo), or iodine (iodo). The prefix "halo" means a group including one more of a fluoro, chloro, bromo, or iodo substituent instead of a hydrogen atom. A combination of halo groups (e.g., bromo and fluoro), or only fluoro groups may be present.

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—NO$_2$), cyano (—CN), hydroxyl (—OH), oxo (=O), amino (—NH$_2$), mono- or di-(C$_{1-6}$)alkylamino, alkanoyl (such as a C$_{2-6}$ alkanoyl group such as acyl), formyl (—C(=O)H), carboxylic acid or an alkali metal or ammonium salt thereof, C$_{2-6}$ alkyl ester (—C(=O)O-alkyl or —OC(=O)-alkyl), C$_{7-13}$ aryl ester (—C(=O)O-aryl or —OC(=O)-aryl), amido (—C(=O)NR$_2$ wherein R is hydrogen or C$_{1-6}$ alkyl), carboxamido (—CH$_2$C(=O)NR$_2$ wherein R is hydrogen or C$_{1-6}$ alkyl), halogen, thiol (—SH), C$_{1-6}$ alkylthio (—S-alkyl), thiocyano (—SCN), C$_{1-6}$ alkyl, C$_{2-6}$ alkenyl, C$_{2-6}$ alkynyl, C$_{1-6}$ haloalkyl, C$_{1-9}$ alkoxy, C$_{1-6}$ haloalkoxy, C$_{3-12}$ cycloalkyl, C$_{5-18}$ cycloalkenyl, C$_{6-12}$ aryl having at least one aromatic ring (e.g., phenyl, biphenyl, naphthyl, or the like, each ring either substituted or unsubstituted aromatic), C$_{7-19}$ arylalkyl having 1 to 3 separate or fused rings and from 6 to 18 ring carbon atoms, arylalkoxy having 1 to 3 separate or fused rings and from 6 to 18 ring carbon atoms, C$_{7-12}$ alkylaryl, C$_{4-12}$ heterocycloalkyl, C$_{3-12}$ heteroaryl, C$_{1-6}$ alkyl sulfonyl (—S(=O)$_2$-alkyl), C$_{6-12}$ arylsulfonyl (—S(=O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a C$_2$ alkyl group substituted with a cyano group.

As used herein, the term "polymer" refers to a polymeric compound containing one or more repeating units, where each repeating unit may be the same or different from each other for the case when there are two or more repeating units present. Thus, the disclosed polymers of the invention can be referred to herein as a "polymer" or a "copolymer."

As used herein, when a definition is not otherwise provided, a "divalent linking group" refers to a divalent group including one or more of —O—, —S—, —Te—, —Se—, —C(O)—, —N(R$^a$)—, —S(O)—, —S(O)$_2$—, —C(S)—, —C(Te)—, —C(Se)—, substituted or unsubstituted C$_{1-30}$ alkylene, substituted or unsubstituted C$_{3-30}$ cycloalkylene, substituted or unsubstituted C$_{1-30}$ heterocycloalkylene, substituted or unsubstituted C$_{6-30}$ arylene, substituted or unsubstituted C$_{7-30}$ arylalkylene, substituted or unsubstituted C$_{1-30}$ heteroarylene, substituted or unsubstituted C$_{3-30}$ heteroarylalkylene, or a combination thereof, wherein R$^a$ is hydrogen, substituted or unsubstituted C$_{1-20}$ alkyl, substituted or unsubstituted C$_{1-20}$ heteroalkyl, substituted or unsubstituted C$_{6-30}$ aryl, or substituted or unsubstituted C$_{4-30}$ heteroaryl. More typically, the divalent linking group includes one or more of —O—, —S—, —C(O)—, —N(R')—, —S(O)—, —S(O)$_2$—, substituted or unsubstituted C$_{1-30}$ alkylene, substituted or unsubstituted C$_{3-30}$ cycloalkylene, substituted or unsubstituted C$_{1-30}$ heterocycloalkylene, substituted or unsubstituted C$_{6-30}$ arylene, substituted or unsubstituted C$_{7-30}$ arylalkylene, substituted or unsubstituted C$_{1-30}$ heteroarylene, substituted or unsubstituted C$_{3-30}$ heteroarylalkylene, or a combination thereof, wherein R' is hydrogen, substituted or unsubstituted C$_{1-20}$ alkyl, substituted or unsubstituted C$_{1-20}$ heteroalkyl, substituted or unsubstituted C$_{6-30}$ aryl, or substituted or unsubstituted C$_{4-30}$ heteroaryl.

Organic underlayer films may be used to protect underlying substrates during various pattern transfer and etch processes. Often these films are cast and cured directly upon an inorganic substrate (i.e. TiN). In these cases, it is desirable that the underlayer film has sufficient adhesion to the substrate during all subsequent processing steps to protect the substrate from otherwise damaging conditions. One commonly used processing step is the wet etch process known as SC-1, which involves submerging the substrate into a hydrogen peroxide/ammonium hydroxide bath. An underlayer film that is not sufficiently adhered to the substrate may delaminate while it is submerged, resulting in exposure of and damage to the underlying inorganic substrate.

The present invention provides an additive for a underlayer formulation that may be applied to form a coating layer over a substrate. The additive includes a nitrogen atom that is attached to a thermally-cleavable protecting group or an acid-cleavable protecting group, and can be a thermal base generating compound or a thermal base generating polymer. The cleavable protecting group is cleaved during curing of the coating composition and the exposed nitrogen atom enhances the adhesion of the underlayer film to a substrate, particularly when the film and substrate are submerged into a hydrogen peroxide/ammonium hydroxide (SC-1) bath.

According to an aspect, a method of forming a pattern is provided that includes the steps of (a) applying a layer of a coating composition over a substrate; (b) curing the applied coating composition to form a coated underlayer; and (c) forming a photoresist layer over the coated underlayer. It is to be understood that the coated underlayer of the invention can be included as a photoresist underlayer, where the photoresist underlayer can be a single layer or a plurality of layers that are referred to herein as "underlayers." Accordingly, at least one of the underlayers of the photoresist underlayer can include the coated underlayer as provided herein.

The coating composition comprises a first material comprising two or more hydroxy groups; a second material comprising two or more glycidyl groups; an additive comprising a protected amino group; and a solvent.

The first material including the two or more hydroxy groups may be polymeric or non-polymeric. In some aspects, the first material comprising two or more hydroxy groups may be a polymer comprising two or more hydroxy groups, for example a polymer having a repeating unit that comprises one or more hydroxy groups, or a repeating unit that comprises 1 to 4 hydroxy groups, preferably a repeating unit that comprises 1 to 3 hydroxy groups, and more typically a repeating unit that comprises 1 or 2 hydroxy groups.

For example, the polymer comprising two or more hydroxy groups may be derived from a monomer comprising one or more hydroxy groups. In an embodiment, the polymer comprising two or more hydroxy groups may include a repeating unit derived from a monomer of formula (1):

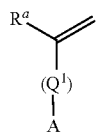

(1)

In formula (1), $R^a$ may be hydrogen, fluorine, cyano, substituted or unsubstituted $C_{1-10}$ alkyl, or substituted or unsubstituted $C_{1-10}$ fluoroalkyl. Preferably, $R^a$ is hydrogen, fluorine, or substituted or unsubstituted $C_{1-5}$ alkyl, typically methyl.

In formula (1), $Q^1$ is a divalent linking group, and typically may be selected from one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, substituted or unsubstituted divalent $C_{3-30}$ heteroarylalkyl, —C(O)—O—, or —C(O)—NR', wherein R' is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl.

In formula (1), A is a hydroxy-substituted $C_{6-30}$ aryl group or a hydroxy-substituted $C_{4-60}$ heteroaryl group, which may be optionally further substituted with one or more of substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, $C_{3-30}$ alkylheteroaryl, —$OR^{1a}$, or —$NR^{1b}R^{1c}$, wherein $R^{1a}$ to $R^{1c}$ are each independently substituted or unsubstituted $C_{1-30}$ alkyl, substituted or unsubstituted $C_{3-30}$ cycloalkyl, substituted or unsubstituted $C_{1-30}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

Non-limiting examples of monomers of formula (1) include:

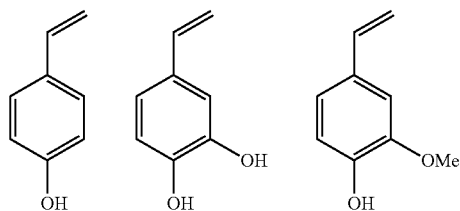

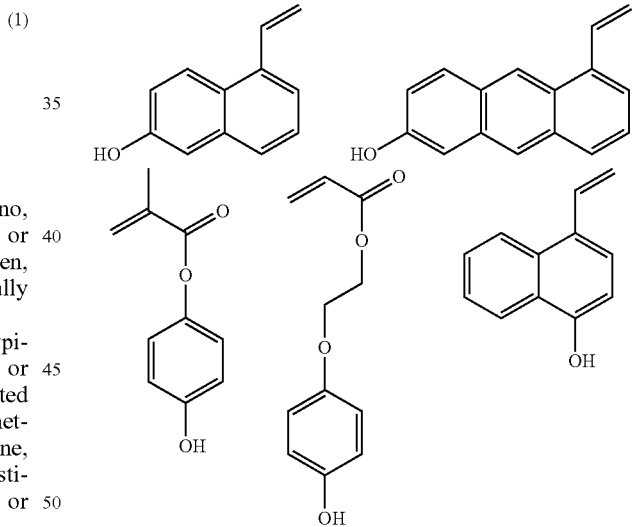

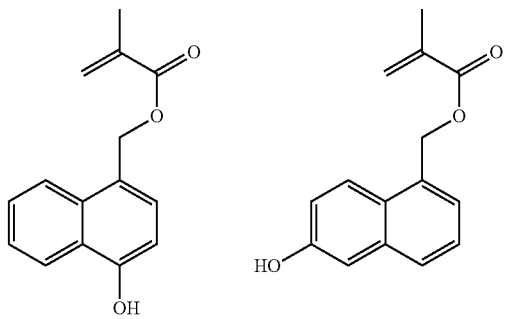

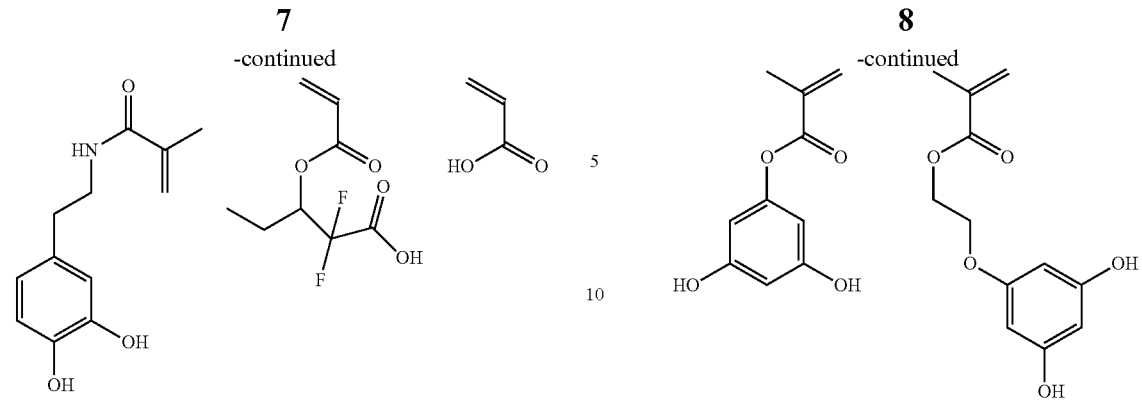

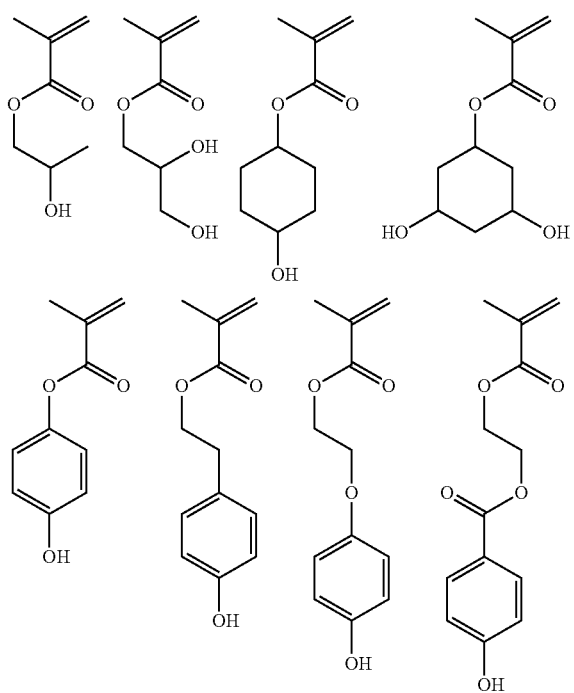

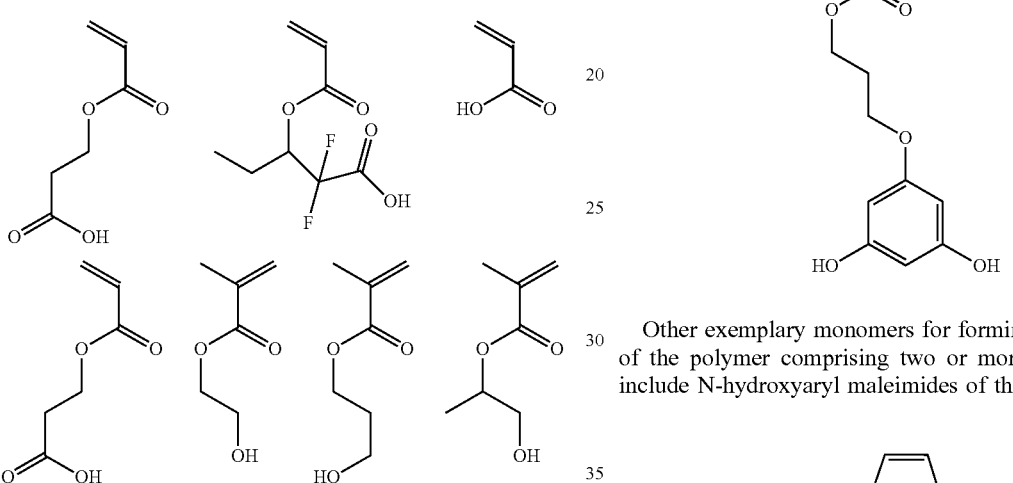

Other exemplary monomers for forming a repeating unit of the polymer comprising two or more hydroxy groups include N-hydroxyaryl maleimides of the structure:

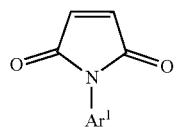

wherein $Ar^1$ is a hydroxy-substituted $C_{6-60}$ aryl group, a hydroxy-substituted $C_{4-60}$ heteroaryl group, or a combination thereof, optionally further substituted with one or more of substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, $C_{3-30}$ alkylheteroaryl, —$OR^{1a}$ or —$NR^{1b}R^{1c}$, wherein $R^{1a}$ to $R^{1c}$ are each independently substituted or unsubstituted $C_{1-30}$ alkyl, substituted or unsubstituted $C_{3-30}$ cycloalkyl, substituted or unsubstituted $C_{1-30}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl. It may be desired for $Ar^1$ to include a single hydroxyl group or a plurality of hydroxyl groups (e.g., $Ar^1$ may be a hydroxy-substituted $C_{6-60}$ aryl group, a hydroxy-substituted $C_{4-60}$ heteroaryl group, or a combination thereof, each of which is independently optionally further substituted with a hydroxyl group). Non-limiting examples of N-hydroxyaryl maleimide monomers include the following:

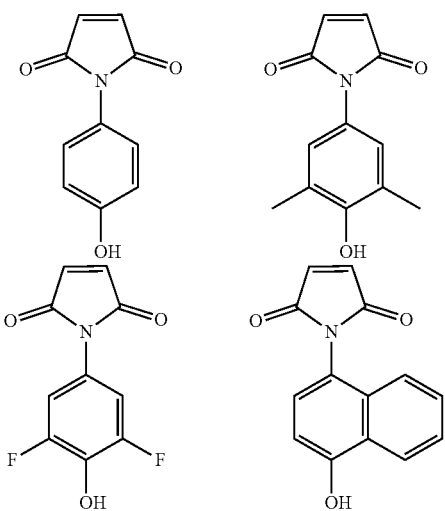

In another embodiment, the polymer may include a repeating unit of formula (2a), (2b), or a combination thereof:

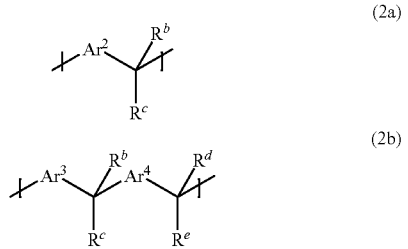

In formulae (2a) and (2b), $Ar^2$ and $Ar^3$ are each independently a substituted or unsubstituted $C_{5-60}$ aromatic group that is substituted with at least one hydroxy group, typically 1 to 3 hydroxy groups, more preferably 1 or 2 hydroxy groups, and can optionally further include one or more heteroatoms chosen from N, O, or S. It is to be understand that the one or more heteroatoms of the $C_{5-60}$ aromatic group may be present as aromatic ring members instead of carbon atoms (e.g., $Ar^2$ and/or $Ar^3$ may be a heteroarylene group), as one or more heteroatoms of a further heteroatom-containing substituent group, or a combination thereof. When the $C_{5-60}$ aromatic group is polycyclic, the ring or ring groups can be fused (such as naphthyl or the like), directly linked (such as biaryls, biphenyl, or the like), and/or bridged by a heteroatom (such as triphenylamino or diphenylene ether). In an embodiment, the polycyclic aromatic group may include a combination of fused and directly linked rings (such as binaphthyl or the like).

In addition to the at least one hydroxy group, the monocyclic or polycyclic $C_{5-60}$ aromatic group of formulae (2a) and (2b) can be further substituted. Exemplary substituents include, but are not limited to, substituted or unsubstituted $C_{1-30}$ alkyl, substituted or unsubstituted $C_{1-30}$ haloalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, substituted or unsubstituted $C_{4-30}$ heteroarylalkyl, halogen, $-OR^{21}$, $-SR^{22}$, or $-NR^{23}R^{24}$, wherein $R^{21}$ is substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl; and $R^{22}$ to $R^{24}$ are each independently hydrogen, substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

In formula (2b), $Ar^4$ is a substituted or unsubstituted $C_{5-60}$ aromatic group, and optionally further includes one or more heteroatoms chosen from N, O, or S. It is to be understand that the one or more heteroatoms of the $C_{5-60}$ aromatic group may be present as aromatic ring members instead of carbon atoms (e.g., $Ar^4$ may be a heteroarylene group), as one or more heteroatoms of a further heteroatom-containing substituent group, or a combination thereof. When the $C_{5-60}$ aromatic group is polycyclic, the ring or ring groups can be fused (such as naphthyl or the like), directly linked (such as biaryls, biphenyl, or the like), and/or bridged by a heteroatom (such as triphenylamino or diphenylene ether). In an embodiment, the polycyclic aromatic group may include a combination of fused and directly linked rings (such as binaphthyl or the like).

In formulae (2a) and (2b), $R^b$, $R^c$, $R^d$, and W are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl. Preferably, $R^b$, $R^c$, $R^d$, and Re are each independently hydrogen or substituted or unsubstituted $C_{1-10}$ alkyl, with hydrogen being typical.

Exemplary repeating units of formula (2a) include the following:

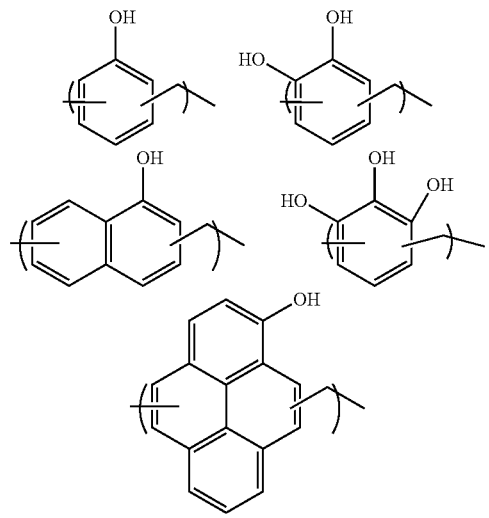

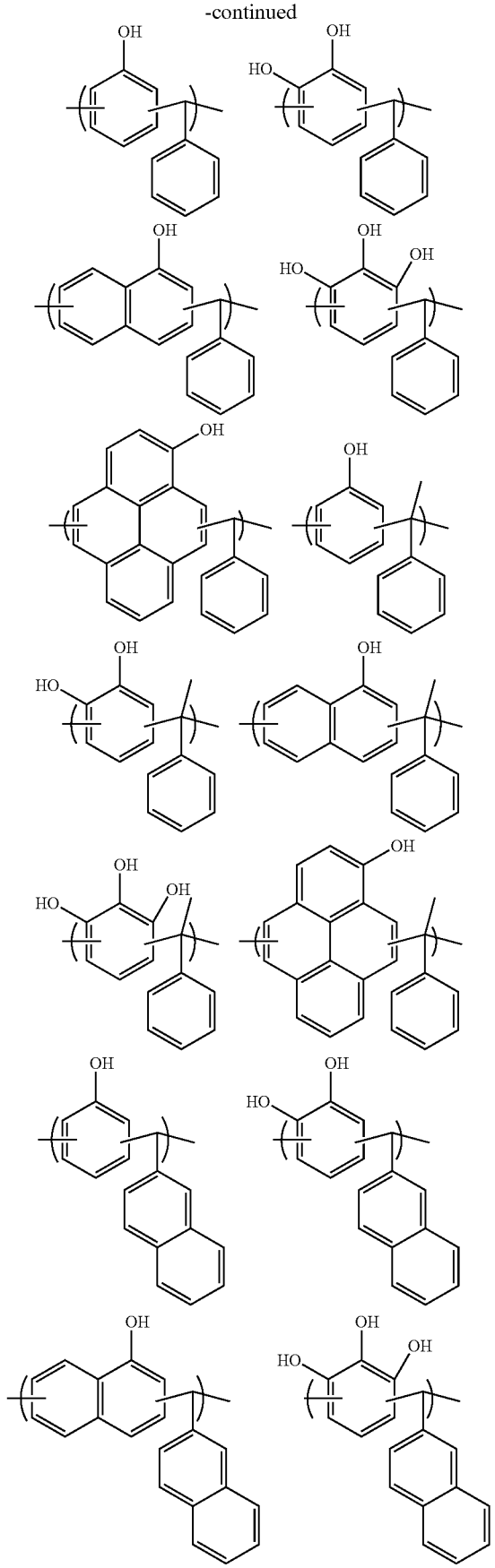

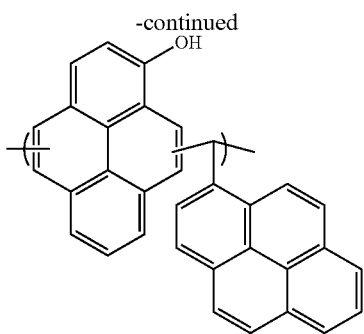

Exemplary repeating units of formula (2b) include the following:

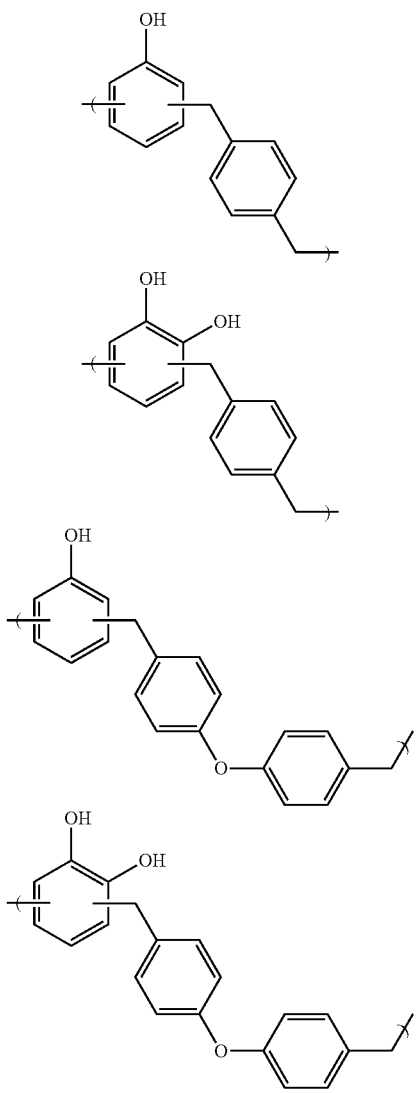

The polymer comprising two or more hydroxy groups may include a repeating unit comprising one or more hydroxy groups in an amount from 2 to 100 mol %, typically 10 to 100 mol %, more typically 50 to 100 mol % based on total repeating units in the polymer.

In other aspects, the first material comprising two or more hydroxy groups may be non-polymeric. Exemplary non-polymeric materials including two or more hydroxy groups include, but are not limited to, tris(4-hydroxyphenyl)methane, 2,6-bis(4-hydroxy-3,5-dimethylbenzyl)-4-methylphenol, 1,1,2,2-tetrakis(4-hydroxyphenyl)ethane, α, α, α', α'-tetrakis(4-hydroxyphenyl)-p-xylene, 2,2-bis[4,4-bis(4-hydroxybenzyl)-cyclohexyl]propane, or a combination thereof.

The first material of the coating composition generally is present in an amount from 5 and 95 weight percent (wt %) of the total solids content of the coating composition, more typically in an amount from 25 to 75 wt % of the total solids content of the coating composition. As used herein, the "total solids content" of the coating composition refers to all materials and components of the coating composition except for the solvent carrier.

The coating composition further includes a second material comprising two or more glycidyl groups, which may be a non-polymeric material or a polymeric material. In an embodiment, the second material comprising two or more glycidyl groups may be a non-polymeric compound comprising two or more glycidyl groups or a polymer comprising two or more glycidyl groups.

Particularly suitable second materials may be polymers that include a repeating unit derived from formula (3):

(3)

In formula (3), $R^a$ may be hydrogen, fluorine, cyano, substituted or unsubstituted $C_{1-10}$ alkyl, or substituted or unsubstituted $C_{1-10}$ fluoroalkyl. Preferably, $R^a$ is hydrogen, fluorine, or substituted or unsubstituted $C_{1-5}$ alkyl, typically methyl.

In formula (3), L is a divalent linking group, and, for example, is typically selected from substituted or unsubstituted $C_{1-30}$ alkylene, substituted or unsubstituted $C_{3-30}$ cycloalkylene, substituted or unsubstituted $C_{2-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{2-30}$ heteroarylalkyl, —O—, —C(O)—, —N($R^{3a}$)—, —S—, or —S(O)$_2$—, wherein $R^{1a}$ is hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl.

In formula (3), Y may be chosen from substituted or unsubstituted $C_{1-30}$ alkyl, or substituted or unsubstituted $C_{6-30}$ aryl, wherein Y comprises at least one epoxy group.

Optionally, L and Y may be taken together to form a carbon alicyclic ring that comprises a pendant or fused epoxy group.

Exemplary monomers of formula (3) include the following:
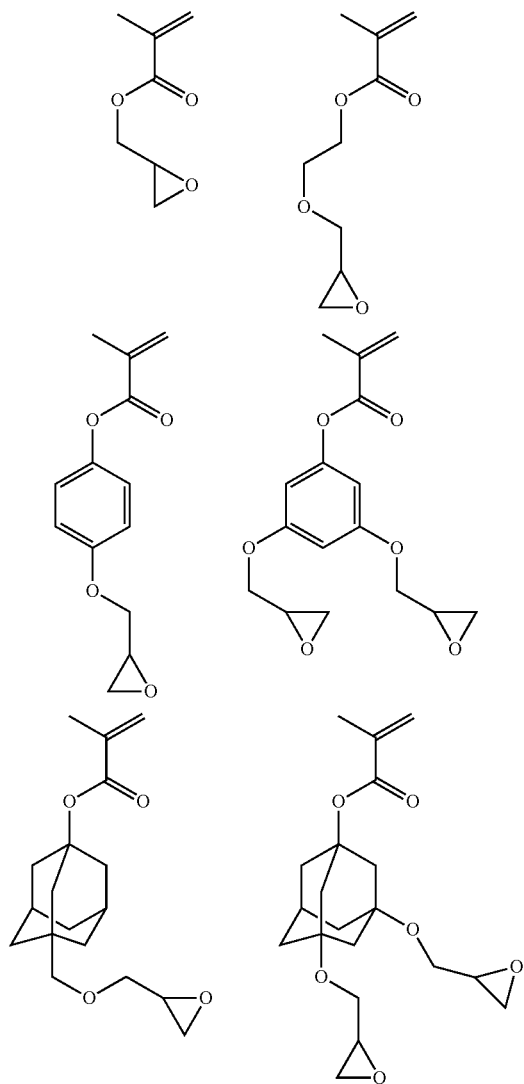
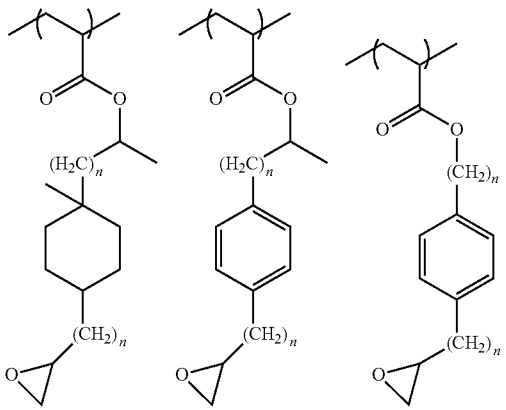
Exemplary second materials that are polymeric may have one or more repeating units of the following formulae:
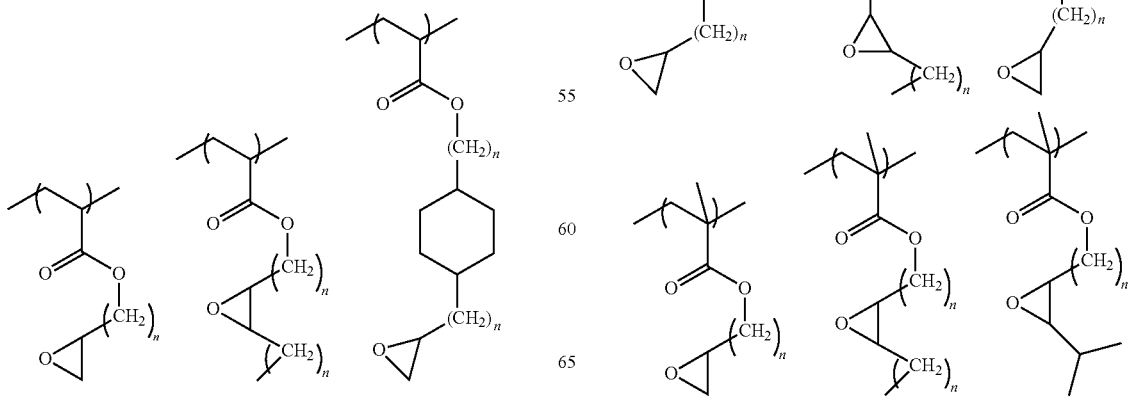
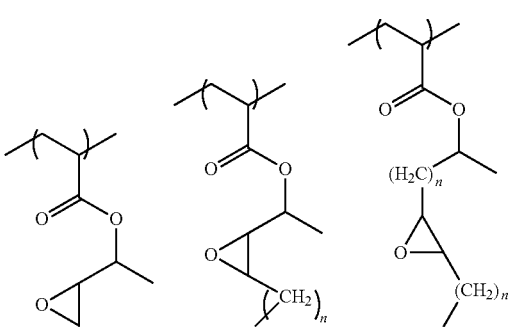
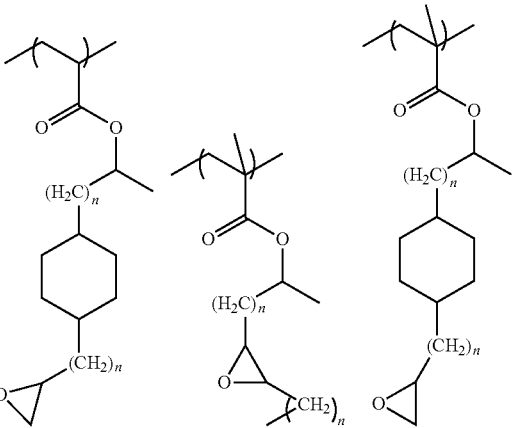
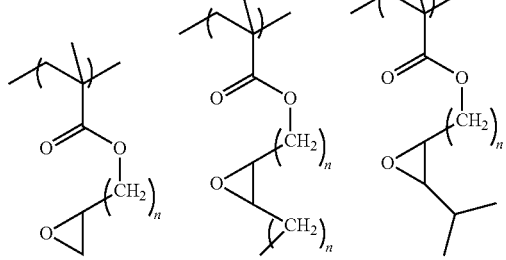

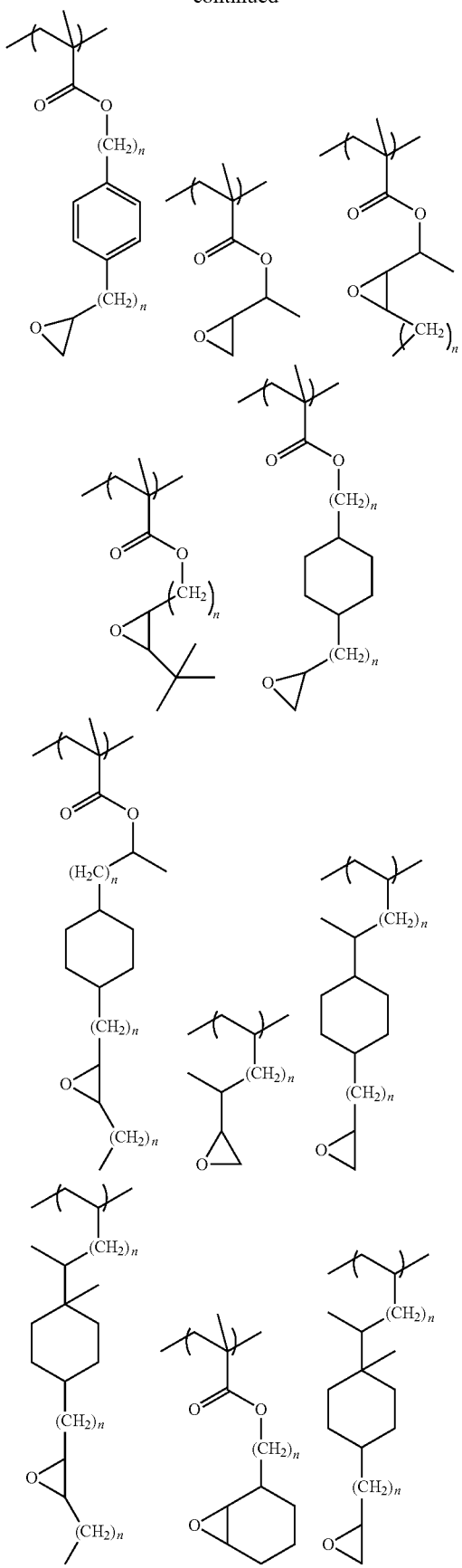

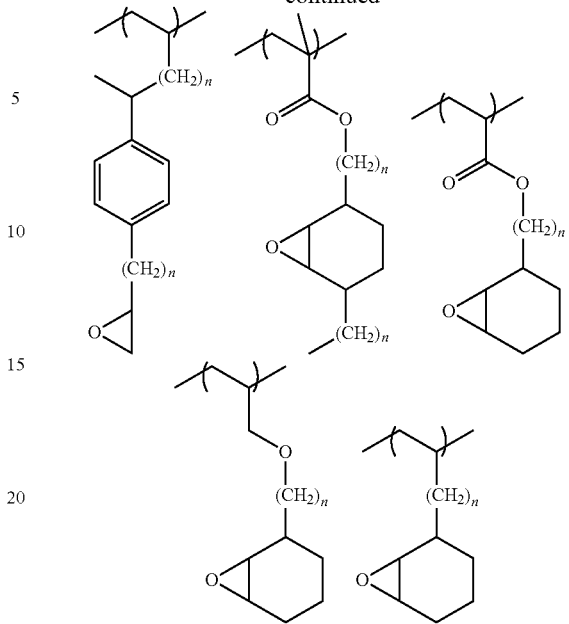

wherein n is an integer from 1 to 6.

In other aspects, the second material comprising two or more glycidyl groups may be non-polymeric. Exemplary non-polymeric second materials are glycidyl-containing compounds, which include 1,1,2,2-tetra(p-hydroxyphenyl)ethane tetraglycidyl ether, glycerol triglycidyl ether, ortho-sec-butylphenyl glycidyl ether, 1,6-bis(2,3-epoxypropoxy)naphthalene, diglycerol polyglycidyl ether, polyethylene glycol glycidyl ether, triglycidyl isocyanurate, 4,4'-methylenebis(N,N-diglycidylaniline), or a combination thereof.

The second material of the coating composition generally is present in an amount from 5 and 99 weight percent (wt %) of total solids content of the coating composition, more typically in an amount from 25 to 75 wt % of total solids content of the coating composition.

The additive is a polymeric or non-polymeric material that comprises a protected amino group. The protected amino group can be derived from a primary or secondary amino moiety. Various amine protecting groups are suitable for use in the present invention, provided such protecting groups are removable (cleavable) by heat, acid, or a combination thereof. Preferably, the amine protecting group is thermally cleavable, such as at a temperature from 75 to 350° C., more preferably from 100 to 300° C., even more preferably from 100 to 250° C.

Suitable amine protecting groups useful in the present invention include carbamates such as 9-fluorenylmethyl carbamates, t-butyl carbamates, and benzyl carbamates; amides such as acetamides, trifluoroacetamides and p-toluenesulfonamides; benzylamines; triphenylmethylamines (tritylamines); and benzylideneamines. Carbamates are the preferred amine protecting group, and t-butyl carbamates (t-BOC) are more preferred. Such amine protecting groups, their formation and their removal are well-known in the art. See, for example, T. W. Green et al., Protective Groups in Organic Synthesis, Wiley-Interscience, New York, 1999.

Preferably, the additive comprises a compound represented by formula (4), a polymer including a repeating unit derived from a monomer of formula (5), or a combination thereof:

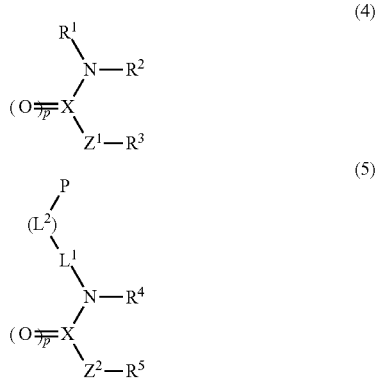

In formulae (4) and (5), X is C or S, wherein when X is C, then p is 1, and when X is S, then p is 2. Typically, X is C.

In formulae (4) and (5), $Z^1$, $Z^2$, $L^1$, and $L^2$ are each independently a single bond or a divalent linking group. For example, $Z^1$, $Z^2$, $L^1$, and $L^2$ each independently may be a single bond or a divalent linking group comprising one or more of substituted or unsubstituted $C_{1-30}$ alkylene, substituted or unsubstituted $C_{1-30}$ heteroalkylene, substituted or unsubstituted $C_{3-30}$ cycloalkylene, substituted or unsubstituted $C_{2-30}$ heterocycloalkylene, substituted or unsubstituted $C_{2-30}$ alkenylene, substituted or unsubstituted $C_{3-30}$ cycloalkenylene, substituted or unsubstituted $C_{6-30}$ arylene, substituted or unsubstituted $C_{1-30}$ heteroarylene, —O—, —C(O)—, —N($R^{4a}$)—, —S—, or —S(O)$_2$—, wherein $R^{4a}$ may be hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl. Preferably, $Z^1$ and $Z^2$ are each independently O—.

In formulae (4) and (5), $R^1$ and $R^2$ each independently may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl.

Optionally, $R^1$ and $R^2$ may together form a ring via a divalent linking group including one or more of substituted or unsubstituted $C_{1-30}$ alkylene, substituted or unsubstituted $C_{3-30}$ cycloalkylene, substituted or unsubstituted $C_{2-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, substituted or unsubstituted divalent $C_{2-30}$ heteroarylalkyl, —O—, —C(O)—, —N($R^{4b}$)—, —S—, or —S(O)$_2$—, wherein $R^{4b}$ may be hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl. Preferably, $R^1$ and $R^2$ are each independently hydrogen, or $R^1$ and $R^2$ together form a ring via a divalent linking group.

In formulae (4) and (5), $R^3$ and $R^5$ each independently may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, substituted or unsubstituted $C_{2-30}$ alkylheteroaryl, —$OR^{4c}$, or —N($R^{4d}$)($R^{4e}$), wherein $R^{4c}$, $R^{4d}$, and $R^{4e}$ are each independently hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl.

Optionally, in formula (5), $L^1$ and $R^4$ together may form a ring via a divalent linking group, for example a divalent linking group comprising one or more of substituted or unsubstituted $C_{1-30}$ alkylene, substituted or unsubstituted $C_{3-30}$ cycloalkylene, substituted or unsubstituted $C_{2-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, substituted or unsubstituted divalent $C_{2-30}$ heteroarylalkyl, —O—, —C(O)—, —N($R^{4f}$)—, —S—, or —S(O)$_2$—, wherein $R^{4f}$ may be hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl.

In formula (5), P is a polymerizable group. Typically, the polymerizable group may be chosen from carboxyl, thiol, amino, epoxy, alkoxy, amido, vinyl, or a combination thereof.

In an embodiment, the additive may be a non-polymeric material, for example a compound of formula (4a) or (4b):

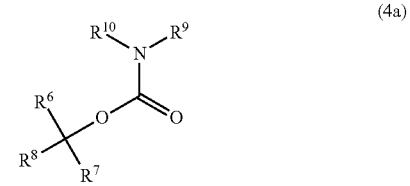

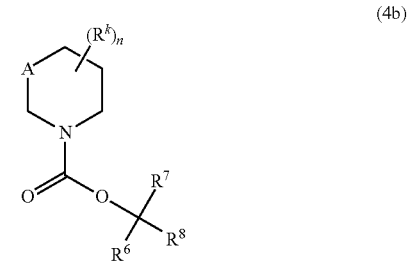

In formulae (4a) and (4b), $R^6$, $R^7$, and $R^8$ each independently may be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl. Optionally, any two or more of $R^6$, $R^7$, and $R^8$ together may form a ring.

In formulae (4b), A is a single bond or substituted or unsubstituted $C_{1-2}$ alkylene, typically methylene.

In formulae (4b), each $R^k$ independently may be each $R^k$ is independently halogen, hydroxy, carboxylic acid, thiol, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl, wherein $R^k$ optionally further comprises one or more of —O—, —C(O)—, —NR$^{k1}$—, —S—, —S(O)—, or —S(O)$_2$—, wherein $R^{k1}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

In formulae (4b), n may be an integer of 0 to 11. Typically, n may be 0, 1, 2, or 3.

In formulae (4a) and (4b), $R^9$ and $R^{10}$ each independently may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl.

In some aspects, the additive comprises a polymeric compound, for example a polymer including a repeating unit derived from a monomer of formula (5a):

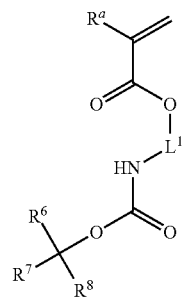

(5a)

In formula (5a), $R^a$ may be hydrogen, fluorine, cyano, substituted or unsubstituted $C_{1-10}$ alkyl, or substituted or unsubstituted $C_{1-10}$ fluoroalkyl. Preferably, $R^a$ is hydrogen, fluorine, or substituted or unsubstituted $C_{1-5}$ alkyl, typically methyl.

In formula (5a), $L^1$ may be a divalent linking group, and, for example, may be chosen from one or more of substituted or unsubstituted $C_{1-30}$ alkylene, substituted or unsubstituted $C_{3-30}$ cycloalkylene, substituted or unsubstituted $C_{2-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{2-30}$ heteroarylalkyl, —O—, —C(O)—, —N(R$^{5a}$)—, —S—, or —S(O)$_2$—, wherein $R^{5a}$ is hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl.

In formula (5a), $R^6$, $R^7$, and $R^8$ each independently may be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl. Optionally, any two or more of $R^6$, $R^7$, and $R^8$ together may form a ring.

In some embodiments, the additive may be a polymer that includes a repeating unit derived from a monomer of formula (5b):

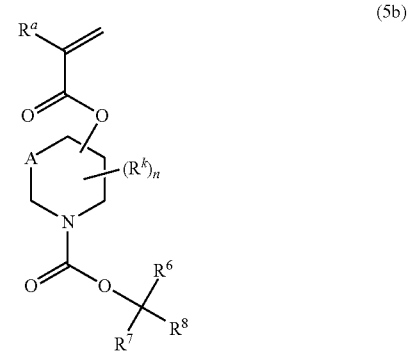

(5b)

In formula (5b), $R^a$ may be hydrogen, fluorine, cyano, substituted or unsubstituted $C_{1-10}$ alkyl, or substituted or unsubstituted $C_{1-10}$ fluoroalkyl. Preferably, $R^a$ is hydrogen, fluorine, or substituted or unsubstituted $C_{1-5}$ alkyl, typically methyl.

In formula (5b), $R^6$, $R^7$, and $R^8$ each independently may be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl. Optionally, any two of $R^6$, $R^7$, and $R^8$ together form a ring.

In formula (5b), A is a single bond or substituted or unsubstituted $C_{1-2}$ alkylene, typically methylene.

In formula (5b), each $R^k$ independently may be halogen, hydroxy, carboxylic acid, thiol, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl, wherein $R^k$ optionally further comprises one or more of —O—, —C(O)—, —NR$^{k2}$—, —S—, —S(O)—, or —S(O)$_2$—, wherein $R^{k2}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl.

In formula (5b), n is an integer of 0 to 3. Typically, n may be 0, 1, or 2.

In some embodiments, in formulae (4) and (5), the unit represented by —X(=O)$_p$—Z$^1$—R$^3$ in formula (4) and the unit represented by —X(=O)$_p$—Z$^2$—R$^5$ in formula (5) each independently may be represented by one of the following:

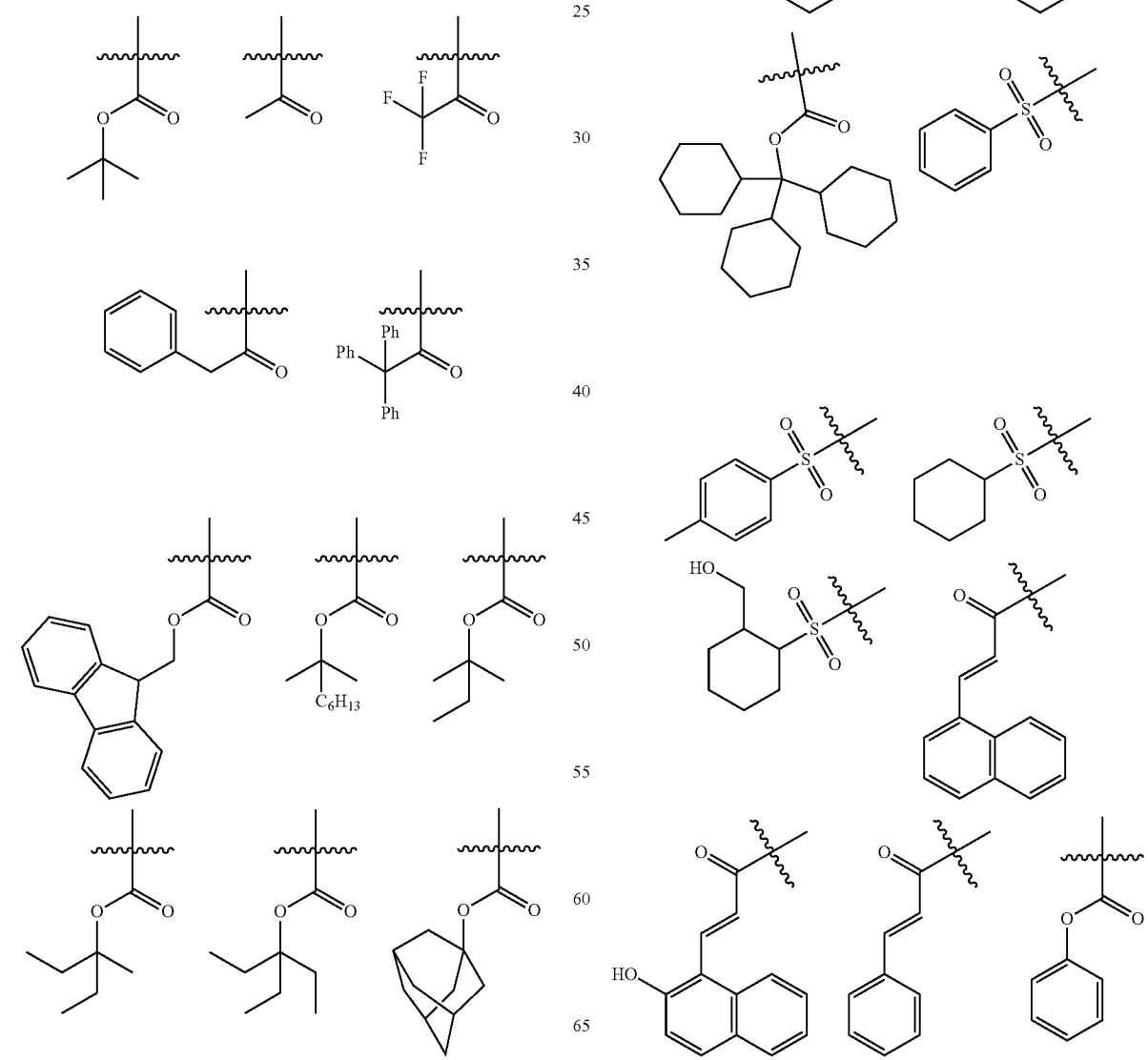

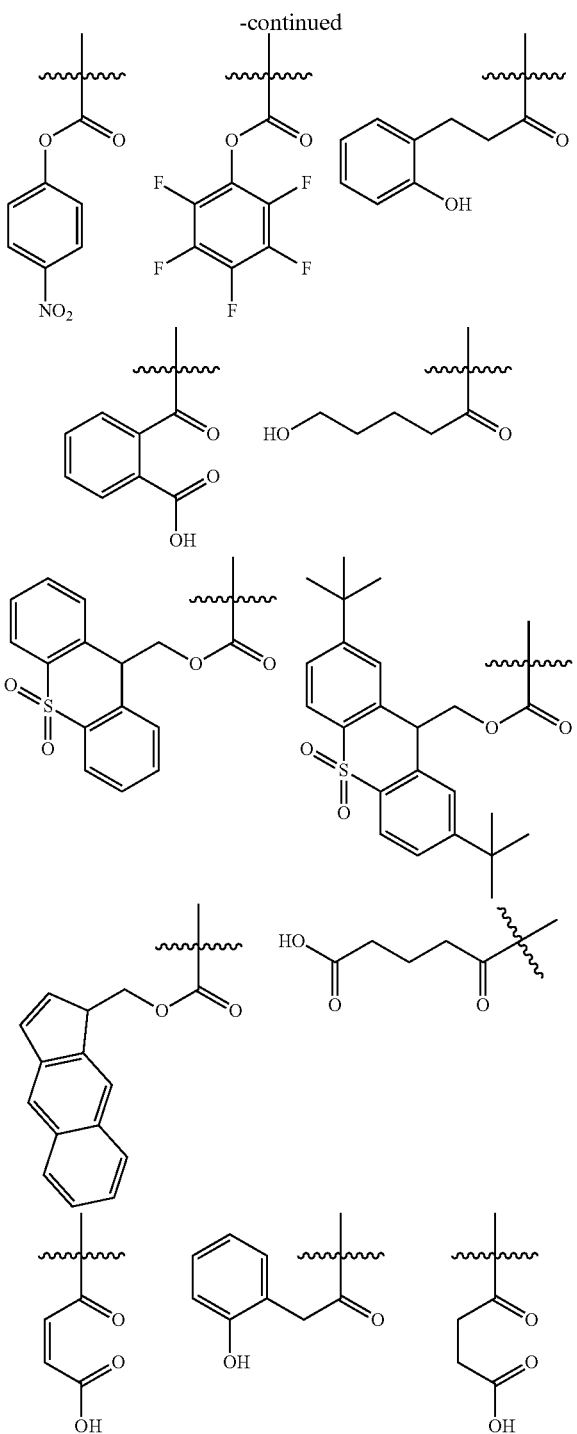

wherein Ph is phenyl.

The additive may be included in the coating composition in an amount from 0.1 to 20 wt %, typically 1 to 20 wt % or 5 to 20 wt %, based on total solids of the coating composition.

It is to be understood that the polymers described herein, including the polymer comprising two or more hydroxy groups, the polymer comprising two or more glycidyl groups, and the polymer additive, each independently may optionally include one or more additional repeating unit(s) different from the repeating units described above. The additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester. The one or more additional repeating units if present in the polymer are typically used in an amount of up to 99 mol %, and typically from 3 to 80 mol %, based on total repeating units of the respective polymer.

Preferably, when the additive is polymeric, the polymer additive may have a weight average molecular weight ($M_w$) of 1,000 to 10,000,000 grams per mole (g/mol), more typically 2,000 to 10,000 g/mol, and a number average molecular weight ($M_n$) of 500 to 1,000,000 g/mol. Molecular weights (either $M_w$ or $M_n$) are suitably determined by gel permeation chromatography (GPC) using polystyrene standards.

Suitable polymers of the present invention can be readily prepared based on and by analogy with the procedures described in the examples of the present application, which are readily understood by those of ordinary skill in the art. For example, one or more monomers corresponding to the repeating units described herein may be combined, or fed separately, using suitable solvent(s) and initiator, and polymerized in a reactor. The monomer composition may further include additives, such as a solvent, a polymerization initiator, a curing catalyst (i.e., the acid catalyst), and the like. For example, the polymer may be obtained by polymerization of the respective monomers under any suitable conditions, such as by heating at an effective temperature, irradiation with activating radiation at an effective wavelength, or a combination thereof.

Also provided is an underlayer coating composition including a first material comprising two or more hydroxy groups as described herein, a second material comprising two or more glycidyl groups as described herein, an additive comprising a protected amino group as described herein, and a solvent.

The coating composition may further include one or more polymers ("additional polymers") in addition to the polymers described above. For example, the coating composition may further include an additional polymer as described above but different in composition, or a polymer that is similar to those described above but does not include each of the three different requisite monomer types. Additionally, or alternatively, the one or more additional polymers can include those well known in the art, for example, polyacrylates, polyvinylethers, polyesters, polynorbornenes, polyacetals, polyethylene glycols, polyamides, polyacrylamides, polyphenols, novolacs, styrenic polymers, and polyvinyl alcohols.

The solvent component of the coating composition may be a single solvent or may include a mixture of two or more distinct solvents. Suitably, each of the multiple solvents may be miscible with each other. Suitable solvents include, for example, one or more oxyisobutyric acid esters, particularly methyl-2-hydroxyisobutyrate, 2-hydroxyisobutyric acid, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

The coating composition may include one or more optional additives including, for example, surfactants and antioxidants. Such optional additives if used are each typically present in the underlayer coating composition in minor amounts such as from 0.01 to 10 wt % based on total solids of the coating composition.

Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

An antioxidant can be added to prevent or minimize oxidation of organic materials in the coating composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethyl-amino-p-cresol, 6-(4-hydroxy-3,5-di-tert-butyl.anilino)2,4-bis.octyl-thio-1,3,5-triazine, n-octadecyl-3-(4'-hydroxy-3', 5'-di-tert-butyl.phenyl)propionate, octylated phenol, aralkyl-substituted phenols, alkylated p-cresol and hindered phenol; bis-, tris- and poly-phenols such as 4,4'-bisphenol, 4,4'-methylene-bis-(dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidene-bis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2, 4,6-tris(3,5-di-tert-butyl-4-hydroxybenzyl)benzene, tris-(2-methyl-4-hydroxy-S-tert-butylphenyl)butane, and tetrakis-[methylene-3-(3',5'-di-tert-butyl-4'-hydroxyphenyl) propionate]methane. Suitable antioxidants are commercially available, for example, Irganox™ antioxidants (Ciba Specialty Chemicals Corp.).

Optionally, the coating composition may further include one or more curing agents to aid in the curing of the coating composition, for example after the coating composition has been applied to a surface. A curing agent is any component which causes curing of the coating composition on the surface of a substrate. Preferred curing agents are thermal acid generators (TAGs). A TAG is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators. The amount of such curing agents useful in the present compositions may be, for example, from greater than 0 to 10 wt %, and typically from greater than 0 to 3 wt % based on total solids of the coating composition.

The coating compositions may further include crosslinking agents including non-epoxy crosslinkers. Any suitable crosslinking agent may be further used in the present coating compositions, provided that such crosslinking agent has at least 2, and preferably at least 3, moieties capable of reacting with functional groups in the coating compositions. Exemplary crosslinking agents include, but are not limited to, novolac resins, melamine compounds, guanamine compounds, isocyanate-containing compounds, benzocyclobutenes, benzoxazines, and the like, and typically any of the foregoing having 2 or more, more typically 3 or more substituents selected from methylol, $C_{1-10}$ alkoxymethyl, and $C_{2-10}$ acyloxymethyl. Examples of suitable crosslinking agents include those shown below:

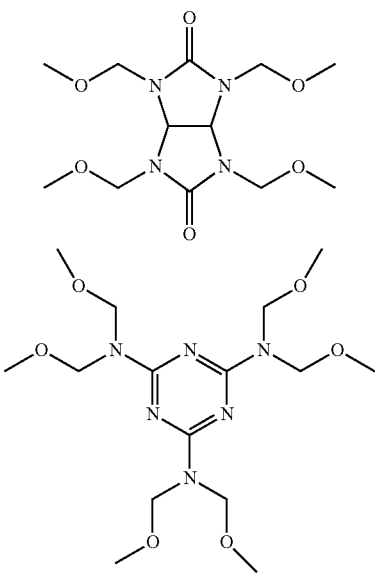

The additional crosslinking agents are well-known in the art and are commercially available from a variety of sources. The amount of such additional crosslinking agents useful in the present coating compositions may be, for example, in the range from greater than 0 to 30 wt %, and preferably from greater than 0 to 10 wt % based on total solids of the coating composition.

It may be beneficial to include an acid generator compound such as a photoacid generator (PAG) and/or a thermal acid generator (TAG) compound in the underlayer compositions. Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxy succinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable thermal acid generators include, for example, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, trifluoromethylbenzenesulfonic acid, perfluorobutane sulfonic acid; and particular onium salts. A variety of aromatic (anthracene, naphthalene, or benzene derivatives) sulfonic acid amine salts can be employed as the TAG, including those disclosed in U.S. Pat. Nos. 3,474,054, 4,200,729, 4,251,665 and 5,187,019. Examples of TAGs include those sold by King Industries, Norwalk, Conn. USA under NACURE, CDX and K-PURE names, for example, NACURE 5225, CDX-2168E, K-PURE 2678 and KPURE 2700. One or more of such TAGs can be used.

If employed, the one or more acid generators may be utilized in relatively lesser amounts in a coating composition, for example, from 0 to 8 wt %, based on total solids of the coating composition.

In some aspects, the coating composition does not include a photoacid generator. Accordingly, the coating composition may be substantially free of a PAG compound and/or polymeric PAG.

The desired total solids content of the coating compositions will depend on factors such as the desired final layer thickness. Typically, the total solids content of the coating composition may be from 0.1 to 20 wt %, for example, from 0.1 to 10 wt %, more typically, from 0.11 to 5 wt %, based on the total weight of the coating composition.

The coating compositions may be prepared following known procedures. For example, the coating compositions may be prepared by combining the first material, the second material, the additive, the solvent, and any optional components, in any order. The coating compositions may be used as is, or may be subjected to purification or dilution prior to being coated on the substrate. Purification may involve, for example, one or more of centrifugation, filtration, distillation, decantation, evaporation, treatment with ion exchange beads, and the like.

The patterning methods of the present invention comprise applying a layer of the coating composition over a substrate; curing the applied coating composition to form a coated underlayer; and forming a photoresist layer over the coated underlayer. The method may further include the steps of pattern-wise exposing the photoresist layer to activating radiation; and developing the exposed photoresist layer to provide a resist relief image. In some aspects, the method may further include forming a silicon-containing layer, an organic antireflective coating layer, or a combination thereof, over the coated underlayer prior to forming the photoresist layer. In some aspect, the method may further include A wide variety of substrates may be used in the patterning methods, with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Typical wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

The substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. The substrate may include one or more layers and patterned features. The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating.

It may be desired in certain patterning methods of the invention to provide one or more lithographic layers such as a hardmask layer, for example, a spin-on-carbon (SOC), amorphous carbon, or metal hardmask layer, a CVD layer such as a silicon nitride (SiN) layer, silicon oxide (SiO) layer, or silicon oxynitride (SiON) layer, an organic or inorganic BARC layer, or a combination thereof, on an upper surface of the substrate prior to forming the photoresist underlayer of the invention. Such layers, together with an underlayer of the invention and photoresist layer, form a lithographic material stack. Typical lithographic stacks which may be used in the patterning methods of the invention include, for example, the following: SOC layer/underlayer/photoresist layer; SOC layer/SiON layer/underlayer/photoresist layer; SOC layer/SiARC layer/underlayer/photoresist layer; SOC layer/metal hardmask layer/underlayer/photoresist layer; amorphous carbon layer/underlayer/photoresist layer; and amorphous carbon layer/SiON layer/underlayer/photoresist layer.

It is to be understood that the "photoresist underlayer," as used herein, refers to the one or more layers that are disposed between the substrate and the photoresist layer (i.e., "above the substrate"). Accordingly, the inventive coated underlayer may be used alone as a photoresist underlayer, or the inventive coated underlayer may be used in conjunction with other underlayers as described herein.

The underlayer coating composition may be coated on the substrate by any suitable means, such as spin-coating, slot-die coating, doctor blading, curtain-coating, roller-coating, spray-coating, dip-coating, and the like. In the case of a semiconductor wafer, spin-coating is preferred. In a typical spin-coating method, the present compositions are applied to a substrate which is spinning at a rate of 500 to 4000 revolutions per minute (rpm) for a period of 15 to 90 seconds to obtain a desired layer of the condensed polymer on the substrate. It will be appreciated by those skilled in the art that the thickness of the coated layer may be adjusted by changing the spin speed, as well as the solids content of the composition. An underlayer formed from the underlayer coating composition typically has a dried layer thickness from 1 to 50 nanometers (nm), more typically from 1 to 10 nm.

The coated underlayer composition is optionally soft-baked at a relatively low temperature to remove any solvent and other relatively volatile components from the underlayer composition. Typically, the substrate is baked at a temperature of less than or equal to 150° C., preferably from 60 to 125° C., and more preferably from 90 to 115° C. The baking time is typically from 10 seconds to 10 minutes, preferably from 30 seconds to 5 minutes, and more preferably from 6 to 90 seconds. When the substrate is a wafer, such baking step may be performed by heating the wafer on a hot plate. Such soft-baking step may be performed as part of the curing of the coating layer, or may be omitted altogether.

The coated underlayer composition is then cured to form a coated underlayer. The coating composition should be sufficiently cured such that the coated underlayer film does not intermix, or minimally intermixes, with another underlayer component or the photoresist layer to be formed above the underlayer. The coated composition may be cured in an oxygen-containing atmosphere, such as air, or in an inert atmosphere, such as nitrogen and under conditions, such as heating, sufficient to provide a cured coating layer. This curing step is preferably conducted on a hot plate-style apparatus, although oven curing may be used to obtain equivalent results. Typically, the curing is conducted at a temperature of 150° C. or greater, and preferably 150 to 450° C. It is more preferred that the curing temperature is 180° C. or greater, still more preferably 200° C. or greater, and even more preferably from 200 to 400° C. The curing time is typically from 10 seconds to 10 minutes, preferably from 30 seconds to 5 minutes, more preferably from 45 seconds to 2 minutes, and still more preferably from 45 to 90 seconds. Optionally, a ramped or a multi-stage curing process may be used. A ramped bake typically begins at a relatively low (e.g., ambient) temperature that is increased at a constant or varied ramp rate to a higher target temperature. A multi-stage curing process involves curing at two or more temperature plateaus, typically a first stage at a lower bake temperature and one or more additional stages at a higher temperature. Conditions for such ramped or multi-stage curing processes are known to those skilled in the art, and may allow for omission of a preceding softbake process.

After curing of the applied coating composition, a photoresist layer is formed over the coated underlayer. As noted above, other intervening layers may be applied between the coated underlayer and the overcoated photoresist layer. In some aspect, the method may further include forming a silicon-containing layer, an organic antireflective coating layer, or a combination thereof, over the coated underlayer prior to forming the photoresist layer.

A wide variety of photoresists may be suitably used in the methods of the invention and are typically positive-tone materials. The particular photoresists to be used will depend on the exposure wavelength used and generally comprise an acid-sensitive matrix polymer, a photoactive component such as a photoacid generator, a solvent, and optional additional components. Suitable photoresists are known to those skilled in the art and are commercially available, for example, various photoresist materials in the UV™ and EPIC™ product families from DuPont Electronics & Imaging. The photoresist can be applied to the substrate by known coating techniques such as described above with reference to the underlayer composition, with spin-coating being typical. A typical thickness for the photoresist layer is from 10 to 300 nm. The photoresist layer is typically next softbaked to minimize the solvent content in the layer, thereby forming a tack-free coating and improving adhesion of the layer to the substrate. The softbake can be conducted on a hotplate or in an oven, with a hotplate being typical. Typical softbakes are conducted at a temperature from 70 to 150° C., and a time from 30 to 90 seconds.

The photoresist layer is next exposed to activating radiation through a photomask to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, and more typically, sub-300 nm, such as 248 nm (KrF), 193 nm (ArF), or an EUV wavelength (e.g., 13.5 nm). In a preferred aspect, the exposure wavelength is 193 nm or an EUV wavelength. The exposure energy is typically from 10 to 100 millijoules per square centimeter ($mJ/cm^2$), depending, for example, on the exposure tool and the components of the photosensitive composition.

Following exposure of the photoresist layer, a post-exposure bake (PEB) is typically performed. The PEB can be conducted, for example, on a hotplate or in an oven. The PEB is typically conducted at a temperature from 70 to 150° C., and a time from 30 to 90 seconds. A latent image defined by the boundary between polarity-switched and unswitched regions (corresponding to exposed and unexposed regions, respectively) is thereby formed. The photoresist layer is next developed to remove the exposed regions of the layer, leaving the unexposed regions forming a patterned photoresist layer. The developer is typically an aqueous alkaline developer, for example, a tetra-alkyl ammonium hydroxide solution such as a tetramethylammonium hydroxide (TMAH) solution, typically a 0.26 Normality (N) (2.38 wt %) solution of TMAH. The developer may be applied by known techniques, for example, spin-coating or puddle coating.

The pattern of the photoresist layer can be transferred to one or more underlying layers including the coated underlayer and to the substrate by appropriate etching techniques, such as by plasma etching using appropriate gas species for each layer being etched. Depending on the number of layers and materials involved, pattern transfer may include multiple etching steps using different etching gases. The patterned photoresist layer, the coated underlayer, and the other optional layers in the lithographic stack may be removed following pattern transfer to the substrate using conventional techniques. Optionally, one or more of the layers of the stack may be removed following, or consumed during, pattern transfer to an underlying layer and prior to pattern transfer to the substrate. For example, pattern transfer to one or more of a silicon-containing layer, an organic antireflective coating layer, or the like may occur after the exposed photoresist layer is developed and before pattern transfer to the coated underlayer. The substrate is then further processed according to known processes to form an electronic device.

Also provided is a layered article including a coated underlayer derived from the inventive coating composition described herein. In an embodiment, a layered article may include a substrate; a coated underlayer disposed over the substrate; and a photoresist layer disposed over the coated underlayer.

Photoresist underlayers, including coated underlayers prepared from the inventive coating compositions show excellent photospeed and improved pattern collapse. Preferred coating compositions of the invention may, as a result, be useful in a variety of semiconductor manufacturing processes The present inventive concept is further illustrated by the following examples. The compounds and reagents used herein were available commercially except as noted below.

EXAMPLES

Synthesis Example 1: Additive A-1

To a round bottom flask were added TBPMA (15 g), V-65 initiator (1.73 g), and tetrahydrofuran (30 g) to form a solution that was purged with nitrogen bubbling for 15 minutes. The solution was then heated at 60° C. for 17 hours under a nitrogen atmosphere. The solution was then allowed to cool to room temperature and the product, represented by Polymer A-1, was precipitated into 500 mL heptanes, collected by filtration, and dried under vacuum for 17 hours at 50° C. Yield: 12.5 g. $M_w$ (GPC): 21,377 g/mol, polystyrene standards.

The monomer and corresponding repeating unit of Additive A-1 are shown below:

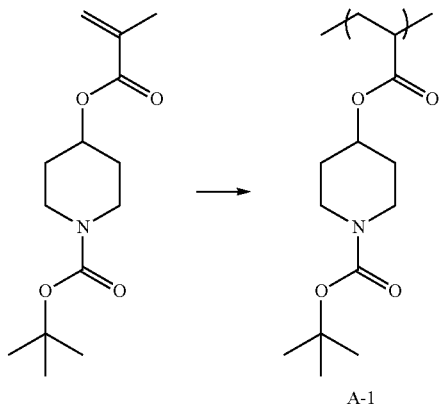

A-1

Synthesis Example 2: Additive A-2

To a round bottom flask were added N-Boc-ethanolamine (10 g), triethylamine (7.58 g), and tetrahydrofuran (60 mL) to form a solution. Methacrylic anhydride (22.0 g) was added to the solution and the resulting mixture was stirred at room temperature for 72 hours. Ethyl acetate (300 mL) was then added to dilute the reaction mixture. The resulting organic solution was washed with saturated sodium bicarbonate (3×200 mL), the organic layer was separated, and the solvent was removed from the organic layer under vacuum by rotatory evaporation. The monomer product, represented by monomer B-1, was obtained by recrystallization from ethyl acetate and drying under vacuum for 17 hours at 50° C. Yield: 10.69 g.

To a round bottom flask were added monomer B-1 (5.01 g), V-65 initiator (0.353 g), and tetrahydrofuran (10.03 g) to form a solution that was purged with nitrogen bubbling for 15 minutes. The solution was then heated at 60° C. for 17 hours under a nitrogen atmosphere. The solution was then allowed to cool to room temperature and the product, represented by Polymer A-2, was precipitated into 500 mL heptanes, collected by filtration, and dried under vacuum for 17 hours at 50° C. Yield 5.27 g. $M_w$ (GPC): 19,193 g/mol, polystyrene standards.

The monomer and corresponding repeating unit of Additive A-2 are shown below:

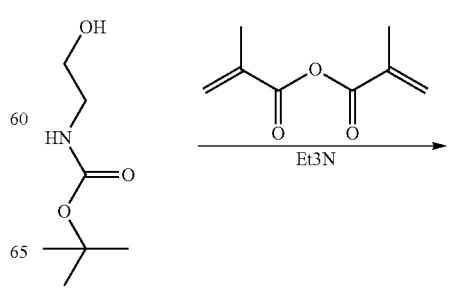

-continued

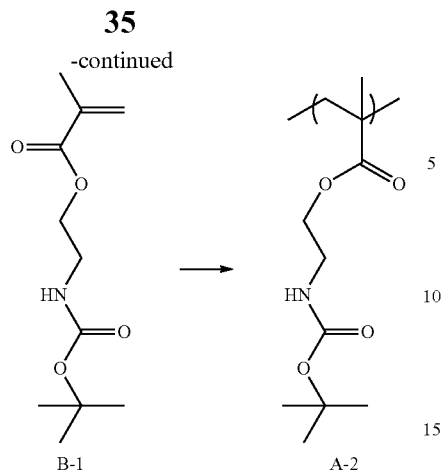

B-1    A-2

-continued

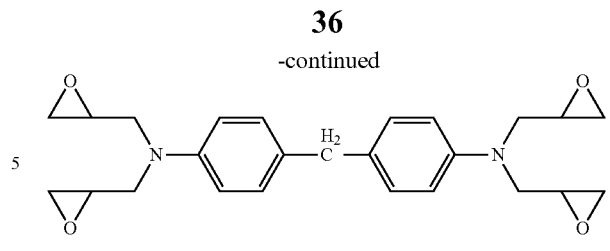

DGA

The structures of additives A-1 and A-2 are provided above in the synthesis examples. The structures of additive A-3 (tert-butyl N-(2-hydroxy-1,1-bis(hydroxymethyl)-ethyl)carbamate) and additive A-4 (tert-butyl (4-hydroxycyclohexyl)carbamate) are as follows:

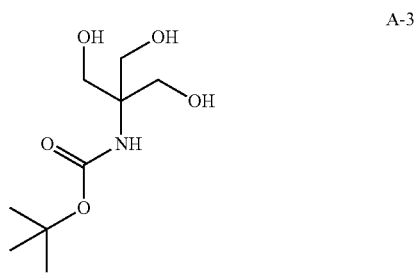

A-3

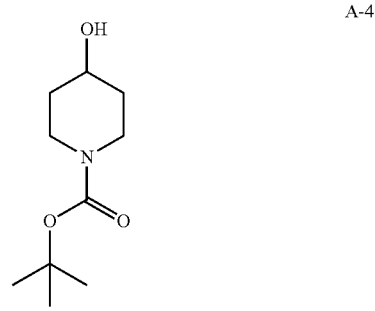

A-4

Coating Compositions

Table 1 shows the coating compositions for Examples 1-8 and Comparative Examples 1-3 that were prepared by mixing the components in the amounts shown. The amounts are in weight percent based on the total weight of the coating composition including Polymer 1, Polymer 2, the additive, and the solvent.

TABLE 1

| Coating Composition | Polymer 1 | Polymer 2 | Additive | Solvent |
|---|---|---|---|---|
| Example 1 | PHS (1.7) | GMA (2.3) | A-1 (0.4) | PGMEA (96.0) |
| Example 2 | PHS (1.7) | GMA (2.3) | A-2 (0.4) | PGMEA (96.0) |
| Example 3 | PHS (1.7) | GMA (2.3) | A-3 (0.4) | PGMEA (96.0) |
| Example 4 | PHS (1.7) | GMA (2.3) | A-4 (0.4) | PGMEA (96.0) |
| Example 5 | CN (1.7) | GMA (2.3) | A-1 (0.4) | PGMEA (96.0) |
| Example 6 | CN (1.7) | GMA (2.3) | A-2 (0.4) | PGMEA (96.0) |
| Example 7 | CN (1.7) | GMA (2.3) | A-3 (0.4) | PGMEA (96.0) |
| Example 8 | CN (1.7) | GMA (2.3) | A-4 (0.4) | PGMEA (96.0) |
| Example 9 | CN (1.7) | DGA (2.3) | A-1 (0.4) | PGMEA (96.0) |
| Example 10 | CN (1.7) | DGA (2.3) | A-2 (0.4) | PGMEA (96.0) |
| Example 11 | CN (1.7) | DGA (2.3) | A-3 (0.4) | PGMEA (96.0) |
| Example 12 | CN (1.7) | DGA (2.3) | A-4 (0.4) | PGMEA (96.0) |
| Comparative Example 1 | PHS (1.7) | GMA (2.3) | None | PGMEA (96.0) |
| Comparative Example 2 | CN (1.7) | GMA (2.3) | None | PGMEA (96.0) |
| Comparative Example 3 | CN (1.7) | None | A-1 (2.3) | PGMEA (96.0) |

The abbreviations used in Table 1 for polymer 1, polymer 2, and solvent are as follows: PHS=poly(hydroxystyrene) ($M_w$ (GPC)=4,299 g/mol); CN=catechol novolac ($M_w$ (GPC)=2,290 g/mol); GMA=poly(glycidyl methacrylate) ($M_w$ (GPC)=3,922 g/mol); DGA=4,4'-methylenebis(N,N-diglycidylaniline); PGMEA=propylene glycol methyl ether acetate.

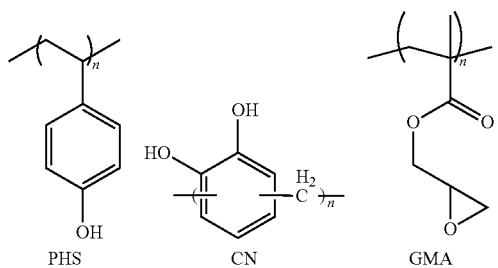

PHS    CN    GMA

The thermal deprotection temperatures of the additives A-1 to A-4 are shown in Table 2. The thermal deprotection temperature is the temperature at which the protecting group is thermally cleaved to form the corresponding deprotected primary or secondary amino group.

TABLE 2

| Additive | Deprotection Temperature (° C.) |
|---|---|
| A-1 | 205 |
| A-2 | 220 |
| A-3 | 153 |
| A-4 | 129 |

Solvent Strip Resistance Evaluation

Solvent strip resistance was measured as an indication of film crosslinking. The coating compositions in Table 1 were filtered through 0.2 μm polytetrafluoroethylene syringe and spin-coated onto respective bare 200-mm silicon wafers on an ACT-8 Clean Track (Tokyo Electron Co.) at 1500 rpm, and then cured at 215° C. for 60 seconds to form a cured coating layer as a film. The initial film thickness was measured with a Therma-Wave OptiProbe™ metrology tool. Solvent strip resistance was determined by applying a PGMEA remover to each of the respective films for 90 seconds followed by a post-strip bake at 105° C. for 60 seconds. The thickness of each respective film was again measured to determine the amount of film thickness that was lost by the application of the PGMEA remover. Table 3 shows the results for film thickness measurements before and after contact with the PGMEA remover, where the results are expressed as the percentage of film thickness remaining on the wafer after contact with the PGMEA remover (% Film Remaining) The amount of film remaining after treatment with the PGMEA remover was indicative of the degree of crosslinking of the cured coating layer.

TABLE 3

| Film Sample | Strip Resistance (%) |
| --- | --- |
| Example 1 | 99.7 |
| Example 2 | 99.8 |
| Example 3 | 99.9 |
| Example 4 | 99.9 |
| Example 5 | 99.2 |
| Example 6 | 99.7 |
| Example 7 | 100 |
| Example 8 | 99.9 |
| Example 9 | 99.3 |
| Example 10 | 97.3 |
| Example 11 | 100.0 |
| Example 12 | 100.0 |
| Comparative Example 1 | 100.0 |
| Comparative Example 2 | 100.0 |
| Comparative Example 3 | 99.5 |

Wet Strip Evaluation

Formulation samples tested were filtered through 0.2 μm polytetrafluoroethylene syringe and spin-coated onto respective bare 200-mm silicon wafers at 1500 rpm and baked at 240° C. for 60 seconds using an ACT-8 Clean Track (Tokyo Electron Co.). Film thickness after baking of each coated film was measured with an OptiProbe™ instrument from Therma-wave Co. The coated sample was then evaluated for SC-1 wet strippability using a mixture of 30% $NH_4OH$/30% $H_2O_2$/water in a w/w/w ratio of 1:1:5. the SC-1 mixture then was heated to 70° C. Coupons of each coated wafer were immersed into the stripping solution for 5 min. The coupons were removed from the SC-1 mixture and rinsed with deionized water. The film quality for each sample was determined by visual inspection.

TABLE 4

| Film Sample | SC1 Resistance (2 minutes) | SC1 Resistance (5 minutes) |
| --- | --- | --- |
| Example 1 | B | — |
| Example 2 | B | — |
| Example 3 | B | — |
| Example 4 | B | — |
| Example 5 | A | A |
| Example 6 | A | B |
| Example 7 | A | A |
| Example 8 | A | A |
| Example 9 | A | A |
| Example 10 | A | A |
| Example 11 | A | A |
| Example 12 | A | A |
| Comparative Example 1 | C | — |
| Comparative Example 2 | A | B |
| Comparative Example 3 | C | — |

The abbreviations used in Table 4 have the following meanings: A: Pristine film, B: partial film degradation, C: fully delaminated film. Each is evaluated by visible eye inspection.

As can be seen from Table 4, the inventive examples comprising a thermal base generator additive demonstrated greater resistance to delamination in the SC1 bath testing compared to the comparative examples without the additives. Examples 1 to 4 showed partial film degradation after 2 minutes in the SC1 bath, while Comparative Example 1 showed full delamination after 2 minutes. Examples 5 and 7 to 12 afforded pristine films after 5 minutes in the SC1 bath, whereas Comparative Example 2 reveal partial film degradation after 5 minutes. Comparative Example 3 demonstrated that omitting the polyepoxide from the coating composition provided a strip-resistant film that lacked resistance to SC1. The inventive examples show the advantages of including a thermal base generator in an underlayer film formulation that comprises a polyphenol and polyepoxide.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a pattern, the method comprising:
applying a layer of a coating composition over a substrate, further comprising a layer disposed between the coating composition and the substrate;
curing the applied coating composition to form a coated underlayer; and
forming a photoresist layer over the coated underlayer, wherein the coating composition comprises:
a first material, comprising two or more hydroxy groups;
25 to 75 wt % of a second material, comprising two or more glycidyl groups, based on total solids content of the coating composition;
an additive; and
a solvent,
wherein the additive comprises a compound represented by formula (4), a polymer comprising a repeating unit derived from a monomer of formula (5), or a combination thereof:

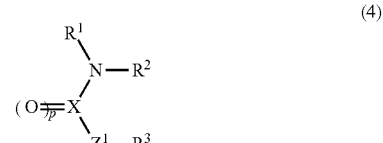

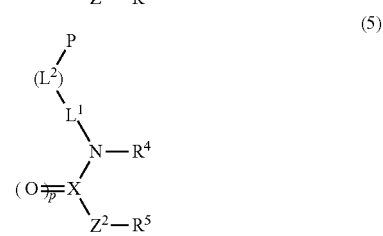

wherein, in formulae (4) and (5),
X is C or S, wherein when X is C, then p is 1, and when X is S, then p is 2;
$Z^1$, $Z^2$, $L^1$, and $L^2$ are each independently a single bond or a divalent linking group;
$R^1$, $R^2$, and $R^4$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl;

optionally, $R^1$ and $R^2$ together form a non-aromatic ring via a divalent linking group;

$R^3$ and $R^5$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, substituted or unsubstituted $C_{2-30}$ alkylheteroaryl, $-OR^{4b}$, or $-N(R^{4c})(R^{4d})$, wherein $R^{4b}$ to $R^{4d}$ are each independently hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl;

optionally, $L^1$ and $R^4$ together form a ring via a divalent linking group; and P is a polymerizable group.

2. The method of claim 1, further comprising forming a silicon-containing layer, an organic antireflective coating layer, or a combination thereof, over the coated underlayer prior to forming the photoresist layer.

3. The method of claim 1, further comprising:
patterning the photoresist layer; and
transferring a pattern from the patterned photoresist layer to the coated underlayer and to a layer below the coated underlayer.

4. The method of claim 3, further comprising:
transferring a pattern to a silicon-containing layer, an organic antireflective coating layer, or a combination thereof, disposed over the coated underlayer, after developing an exposed photoresist layer and before the step transferring the pattern to the coated underlayer.

5. The method of claim 1, wherein the additive comprises a compound of formula (4a) or (4b):

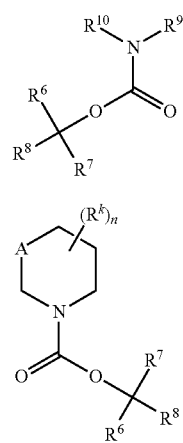

(4a)

(4b)

wherein, in formulae (4a) and (4b), $R^6$, $R^7$, and $R^8$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl;

optionally, any two or more of $R^6$, $R^7$, and $R^8$ together form a ring;

A is a single bond, or substituted or unsubstituted $C_{1-2}$ alkylene;

each $R^k$ is independently halogen, hydroxy, carboxylic acid, thiol, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl, wherein $R^k$ optionally further comprises as part of its structure one or more of $-O-$, $-C(O)-$, $-NR^{k1}-$, $-S-$, $-S(O)-$, or $-S(O)_2-$, wherein $R^{k1}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl;

n is an integer of 0 to 11; and $R^9$ and $R^{10}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl.

6. The method of claim 1, wherein the additive comprises a polymer comprising a repeating unit derived from a monomer of formula (5a):

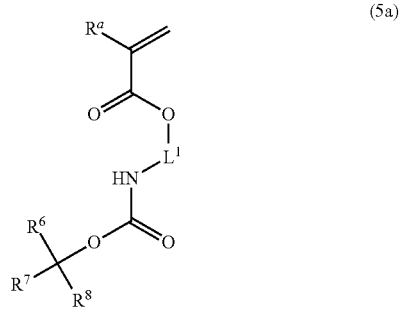

(5a)

wherein, in formula (5a),
   R$^a$ is hydrogen, fluorine, substituted or unsubstituted C$_{1-5}$ alkyl, or substituted or unsubstituted C$_{1-5}$ fluoroalkyl;
   L$^1$ is a divalent linking group;
   R$^6$, R$^7$, and R$^8$ are each independently substituted or unsubstituted C$_{1-20}$ alkyl, substituted or unsubstituted C$_{3-20}$ cycloalkyl, substituted or unsubstituted C$_{3-20}$ heterocycloalkyl, substituted or unsubstituted C$_{2-20}$ alkenyl, substituted or unsubstituted C$_{3-20}$ cycloalkenyl, substituted or unsubstituted C$_{3-20}$ heterocycloalkenyl, substituted or unsubstituted C$_{6-20}$ aryl, or substituted or unsubstituted C$_{4-20}$ heteroaryl; and
   optionally, any two or more of R$^6$, R$^7$, and R$^8$ form a ring together via a divalent linking group.

7. The method of claim 1, wherein the additive comprises a polymer comprising a repeating unit derived from a monomer of formula (5b),

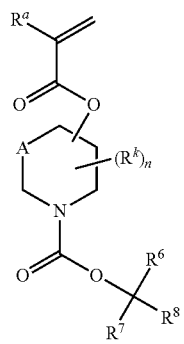

(5b)

wherein, in formula (5b),
   R$^a$ is hydrogen, fluorine, substituted or unsubstituted C$_{1-5}$ alkyl, or substituted or unsubstituted C$_{1-5}$ fluoroalkyl;
   R$^6$, R$^7$, and R$^8$ are each independently substituted or unsubstituted C$_{1-20}$ alkyl, substituted or unsubstituted C$_{3-20}$ cycloalkyl, substituted or unsubstituted C$_{3-20}$ heterocycloalkyl, substituted or unsubstituted C$_{2-20}$ alkenyl, substituted or unsubstituted C$_{3-20}$ cycloalkenyl, substituted or unsubstituted C$_{3-20}$ heterocycloalkenyl, substituted or unsubstituted C$_{6-20}$ aryl, or substituted or unsubstituted C$_{4-20}$ heteroaryl;
   optionally, any two of R$^6$, R$^7$, and R$^8$ form a ring together via a divalent linking group;
   A is a single bond or substituted or unsubstituted C$_{1-2}$ alkylene;
   each R$^k$ is independently halogen, hydroxy, carboxylic acid, thiol, substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{2-30}$ alkenyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{1-30}$ heteroaryl, substituted or unsubstituted C$_{2-30}$ heteroarylalkyl, or substituted or unsubstituted C$_{2-30}$ alkylheteroaryl, wherein R$^k$ optionally further comprises one or more of —O—, —C(O)—, —NR$^{k2}$—, —S—, —S(O)—, or —S(O)$_2$—, wherein R$^{k2}$ is substituted or unsubstituted C$_{1-30}$ alkyl, substituted or unsubstituted C$_{3-30}$ cycloalkyl, substituted or unsubstituted C$_{1-20}$ heterocycloalkyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{4-30}$ heteroaryl, substituted or unsubstituted C$_{5-30}$ heteroarylalkyl, or substituted or unsubstituted C$_{5-30}$ alkylheteroaryl; and
   n is an integer of 0 to 3.

8. The method of claim 1, wherein the coating composition does not comprise a photoacid generator.

9. The method of claim 1, wherein the patterning of the photoresist underlayer comprises exposing the photoresist layer to activating radiation at an exposure wavelength of 193 nm or an EUV wavelength.

10. A layered article, comprising:
   a substrate;
   a coated underlayer disposed over the substrate;
   a layer disposed between the coated underlayer and the substrate; and
   a photoresist layer disposed over the coated underlayer,
   wherein the coated underlayer is derived from a coating composition comprising:
      a first material comprising two or more hydroxy groups;
      25 to 75 wt % of a second material comprising two or more glycidyl groups, based on total solids content of the coating composition;
      an additive; and
      a solvent,
   wherein the additive comprises a compound represented by formula (4), a polymer comprising a repeating unit derived from a monomer of formula (5), or a combination thereof:

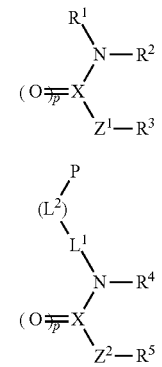

(4)

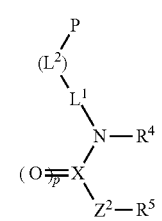

(5)

wherein, in formulae (4) and (5),
   X is C or S, wherein when X is C, then p is 1, and when X is S, then p is 2;
   Z$^1$, Z$^2$, L$^1$, and L$^2$ are each independently a single bond or a divalent linking group;
   R$^1$, R$^2$, and R$^4$ are each independently hydrogen, substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{2-30}$ heterocycloalkyl, substituted or unsubstituted C$_{2-30}$ alkenyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{1-30}$ heteroaryl, substituted or unsubstituted C$_{2-30}$ heteroarylalkyl, or substituted or unsubstituted C$_{2-30}$ alkylheteroaryl;
   optionally, R$^1$ and R$^2$ together form a non-aromatic ring via a divalent linking group;

$R^3$ and $R^5$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, substituted or unsubstituted $C_{2-30}$ alkylheteroaryl, —$OR^{4b}$ or —$N(R^{4c})(R^{4d})$, wherein $R^{4b}$ to $R^{4d}$ are each independently hydrogen, substituted or unsubstituted $C_{1-20}$ alkyl, substituted or unsubstituted $C_{3-20}$ cycloalkyl, substituted or unsubstituted $C_{2-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, or substituted or unsubstituted $C_{2-30}$ heteroarylalkyl;

optionally, $L^1$ and $R^4$ together form a ring via a divalent linking group; and P is a polymerizable group.

11. The layered article of claim 10, wherein the additive comprises a compound of formula (4a) or (4b):

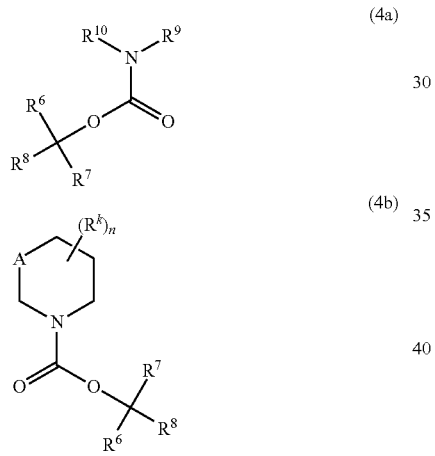

wherein, in formulae (4a) and (4b), $R^6$, $R^7$, and $R^8$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl;

optionally, any two or more of $R^6$, $R^7$, and $R^8$ together form a ring;

A is a single bond, or substituted or unsubstituted $C_{1-2}$ alkylene;

each $R^k$ is independently halogen, hydroxy, carboxylic acid, thiol, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl, wherein $R^k$ optionally further comprises as part of its structure one or more of —O—, —C(O)—, —$NR^{k1}$—, —S—, —S(O)—, or —$S(O)_2$—, wherein $R^{k1}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl;

n is an integer of 0 to 11; and $R^9$ and $R^{10}$ are each independently hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl.

12. The layered article of claim 10, wherein the additive comprises a polymer comprising a repeating unit derived from a monomer of formula (5a):

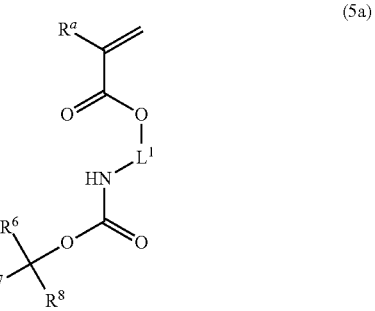

wherein, in formula (5a), $R^a$ is hydrogen, fluorine, substituted or unsubstituted $C_{1-5}$ alkyl, or substituted or unsubstituted $C_{1-5}$ fluoroalkyl;

$L^1$ is a divalent linking group;

$R^6$, $R^7$, and $R^8$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl; and optionally, any two or more of $R^6$, $R^7$, and $R^8$ form a ring together via a divalent linking group.

13. The layered article of claim 10, wherein the additive comprises a polymer comprising a repeating unit derived from a monomer of formula (5b),

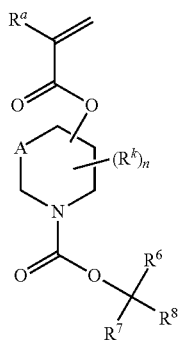

(5b)

wherein, in formula (5b),
- $R^a$ is hydrogen, fluorine, substituted or unsubstituted $C_{1-5}$ alkyl, or substituted or unsubstituted $C_{1-5}$ fluoroalkyl;
- $R^6$, $R^7$, and $R^8$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl;
- optionally, any two of $R^6$, $R^7$, and $R^8$ form a ring together via a divalent linking group;
- A is a single bond or substituted or unsubstituted $C_{1-2}$ alkylene;
- each $R^k$ is independently halogen, hydroxy, carboxylic acid, thiol, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{2-30}$ heterocycloalkyl, substituted or unsubstituted $C_{2-30}$ alkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{1-30}$ heteroaryl, substituted or unsubstituted $C_{2-30}$ heteroarylalkyl, or substituted or unsubstituted $C_{2-30}$ alkylheteroaryl, wherein $R^k$ optionally further comprises one or more of —O—, —C(O)—, —NR$^{k2}$—, —S—, —S(O)—, or —S(O)$_2$—, wherein $R^{k2}$ is substituted or unsubstituted $C_{1-30}$ alkyl, substituted or unsubstituted $C_{3-30}$ cycloalkyl, substituted or unsubstituted $C_{1-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{4-30}$ heteroaryl, substituted or unsubstituted $C_{5-30}$ heteroarylalkyl, or substituted or unsubstituted $C_{5-30}$ alkylheteroaryl; and
- n is an integer of 0 to 3.

14. The layered article of claim 10, wherein the coating composition does not comprise a photoacid generator.

15. The layered article of claim 10, further comprising a silicon-containing layer, an organic antireflective coating layer, or a combination thereof,
wherein the silicon-containing layer, the organic antireflective coating layer, or the combination thereof is disposed between the coated underlayer and the photoresist layer.

16. An electronic device fabricated from the layered article of claim 10.

* * * * *